(12) United States Patent
Connell et al.

(10) Patent No.: US 7,177,616 B2
(45) Date of Patent: Feb. 13, 2007

(54) HIGH LINEARITY AND LOW NOISE CMOS MIXER AND SIGNAL MIXING METHOD

(75) Inventors: Lawrence E. Connell, Naperville, IL (US); Yan Cui, Gurnee, IL (US); Poojan A. Wagh, Sleepy Hollow, IL (US); Patrick L. Rakers, Kildeer, IL (US)

(73) Assignee: Freescale Semiconductor, Inc., Austin, TX (US)

( * ) Notice: Subject to any disclaimer, the term of this patent is extended or adjusted under 35 U.S.C. 154(b) by 348 days.

(21) Appl. No.: 10/917,891

(22) Filed: Aug. 13, 2004

(65) Prior Publication Data

US 2006/0035611 A1   Feb. 16, 2006

(51) Int. Cl.
*G06F 3/033* (2006.01)
*H04B 1/18* (2006.01)

(52) U.S. Cl. .................. 455/296; 455/278.1; 455/130

(58) Field of Classification Search ........ 455/130–131, 455/135, 190.1, 296, 278.1, 277.2, 222, 283, 455/302, 165.1, 183.1, 285
See application file for complete search history.

(56) References Cited

U.S. PATENT DOCUMENTS

| | | | |
|---|---|---|---|
| 5,859,559 A * | 1/1999 | Hong et al. | 327/359 |
| 6,687,491 B2 * | 2/2004 | Wieck | 455/234.1 |
| 7,046,980 B1 * | 5/2006 | Manku et al. | 455/323 |
| 7,062,248 B2 * | 6/2006 | Kuiri | 455/334 |
| 7,079,825 B2 * | 7/2006 | Wieck | 455/234.1 |
| 2004/0077324 A1 * | 4/2004 | Wieck | 455/234.1 |
| 2006/0009186 A1 * | 1/2006 | Liu et al. | 455/283 |
| 2006/0199562 A1 * | 9/2006 | Taylor | 455/333 |

FOREIGN PATENT DOCUMENTS

EP    1 184 971 A1    3/2002

OTHER PUBLICATIONS

Michiel Steyaert, et al, A Fully-Integrated GPS Receiver Front-End with 40mW Power Consumption, ISSCC 2002, Feb. 6, 2002, 24.1, Leuven, Belgium.

Jan Crols et al, a 1.5 GHz Highly Linear CMOS Downconversion Mixer, IEEE Journal of Solid-State Circuits, vol. 30, No. 7, Jul. 1995, pp. 736-742.

(Continued)

*Primary Examiner*—Sonny Trinh
(74) *Attorney, Agent, or Firm*—Ingrassia Fisher & Lorenz (57) ABSTRACT

Method and apparatus are provided for high linearity and low noise communication signal mixing. The apparatus includes a high linearity low noise mixer having an input stage coupled to a switch stage by a series-coupled blocking capacitance and input resistance. The input stage includes a buffer with negative feedback, and the switch stage includes a transistor based switch network connected to an amplifier that has feedback resistance and shunting capacitance. The method includes AC coupling an RF signal, increasing a gain of the RF signal, reducing third-order distortion by negatively feeding-back the RF signal, blocking IM2 generated from said gain increasing step, increasing a second-order input intercept point (IIP2) by attenuating the RF signal across a resistance, and applying a local oscillator input to the RF signal.

29 Claims, 2 Drawing Sheets

OTHER PUBLICATIONS

Edwin E. Bautista, et al, A High IIP2 Downconversion Mixer Using Dynamic Matching, IEEE Journal of Solid-State Circuits vol. 30 No. 7, Dec. 2000, pp. 1934-1941.

Rahul Magoon et al, Single-Chip Quad-Band (850/900/1800/1900 MHz) Direct Conversion GSM/GPRS RF Transceiver with Integrated VCOs and Fractional-N Synthesizer, IEEE Journal of Solid-State Circuits vol. 30 No. 7, Dec. 2002, pp. 1710-1720.

Jussi Ryynanen et al, A Single-Chip Multimode Receiver for GSM900, DCS1800, PCS1900, and WCDMA, IEEE Journal of Solid-State Circuits vol. 30 No. 7, Apr. 2003, pp. 594-601.

Danilo Manstretta et al, Second-Order Intermodulation Mechanisms in CMOS Downconverters, IEEE Journal of Solid-State Circuits vol. 30 No. 7, Mar. 2003, pp. 394-406.

* cited by examiner

HIGH LINEARITY AND LOW NOISE CMOS MIXER AND SIGNAL MIXING METHOD

FIELD OF THE INVENTION

The present invention generally relates to communications, and more particularly relates to mixer circuits and related methods in communications.

BACKGROUND OF THE INVENTION

Mixer circuits, or mixers, are widely used in modern communication systems and have a number of uses. A typical application is for translating signals into desirable frequency bands through a technique called modulation. In a mixing or modulation process, an information signal is superimposed upon a carrier signal. In this way, the information signal may be processed or transmitted while minimizing, and at times without, information loss. Another principle application of mixer circuits is for demodulation. In demodulation, a modulated information signal is typically translated to an intermediate frequency.

Mixers are generally designed to minimize inter-modulation (IM) distortion. This distortion is usually caused by non-linear translations of the input signal and typically affects the dynamic range of the communication system. Additionally, mixers are generally designed to sustain large interference signals without desensitizing while maintaining a low noise figure to optimize overall system performance.

Analog multipliers or mixers may be used in a wide range of communications applications. For example, analog multipliers are typically used in down converters in radio frequency (RF) receivers. In RF receivers, analog multipliers may be used to convert a high frequency or RF input signal to an intermediate frequency (IF) signal or to a base-band signal. To perform a down conversion, the analog multiplier receives a carrier RF input signal as well as a mixing frequency from a local oscillator (LO). A desired output signal from the down converter, usually the IF signal, is generally a difference of the RF input signal and the mixing frequency LO signal (e.g., RF−LO). In addition, other signals, including a signal at a center frequency of a sum of the RF input signal and the mixing frequency LO signal (e.g., RF+LO), as well as harmonics of fundamental frequencies, are usually generated. For a downconverter application, the frequency generated at (RF+LO) generally has the greatest amplitude of the undesired signals.

In low-IF or direct-conversion receiver architecture, the mixer output may be directly coupled to an analog base-band. Second-order inter-modulation (IM2) spurs can pass to the mixer output. The result of this may be a raised noise floor component of the mixer output. The IM2 spurs are generally caused by mismatches of devices in the receiver architecture which may also occur in differential circuit topology. In the event that all components of the receiver architecture are ideally matched, the second-order terms, derived from the input signal, at the output tend to cancel each other. In a mismatched design, the second-order terms tend to remain in the output.

One concern with low-IF or direction-conversion receiver architectures is a relatively stringent requirement for IIP2 and third-order input intercept point (IIP3). For a direct-conversion receiver where a desired signal of interest is downconverted from RF to base-band through a single modulation process, interference from second-order nonlinearities, such as IM2, is usually detrimental to system performance. To protect a direct-conversion receiver from such undesirable spurious response, a high second-order input intercept point (IIP2) is desirable. IIP2 generally represents an input amplitude at which the desired signal becomes equal in amplitude to a spectral component generated from IM2.

Accordingly, a mixer circuit is desired having high linearity and low noise that may be used in direct-conversion receivers or low-IF receivers. In addition, a mixer circuit is desired having low noise performance of a buffer stage, high IIP3 of a buffer stage, and high IIP2 of the switch stage. Furthermore, other desirable features and characteristics of the present invention will become apparent from the subsequent detailed description of the invention and the appended claims, taken in conjunction with the accompanying drawings and this background of the invention.

BRIEF SUMMARY

According to various exemplary embodiments, an apparatus is provided for a high linearity and low noise mixer and a method is provided for reducing noise and distortion in a demodulated radio frequency (RF) signal. In one exemplary embodiment, the apparatus is a mixer circuit having an RF signal input, a coupling network coupled to the RF signal input, a buffer coupled to the coupling network and having a first buffer input and a first buffer output, a feedback network coupling the first buffer input and the first buffer output, a blocking capacitor coupled to the first buffer output, an input resistor coupled to the blocking capacitor, a transistor based network switch having a switch output and a switch input coupled to the input resistor, a local oscillator (LO) input coupled to the transistor based network switch, and an operational amplifier (OPAM) having an OPAM input coupled to the switch output.

In a second exemplary embodiment, the apparatus is a direct conversion radio receiver having an antenna configured to receive an RF signal, a bandpass filter coupled to the antenna, a low noise amplifier (LNA) coupled to the bandpass filter, a coupling capacitance coupled to the LNA, and a mixer coupled to the coupling capacitance and having a local oscillator (LO) input. The mixer includes a cascode buffer having a buffer input and a buffer output, a feedback capacitance coupling the buffer input with the buffer output, a blocking capacitance coupled to the buffer output, an input resistance coupled to the blocking capacitance, a switch network coupled to the LO input, and an operational amplifier (OPAM) having an OPAM input. The buffer input is coupled to the coupling capacitance. The switch network has a switch input coupled to the input resistance and a switch output coupled to the OPAM input.

In a third exemplary embodiment, the method includes AC coupling an RF signal, increasing a gain of the RF signal, reducing third-order distortion by negatively feeding-back the RF signal, blocking IM2 generated from said gain increasing step, increasing a second-order input intercept point (IIP2) by attenuating the RF signal across a resistance, and applying a local oscillator input to the RF signal.

BRIEF DESCRIPTION OF THE DRAWINGS

The present invention will hereinafter be described in conjunction with the following drawing figures, wherein like numerals denote like elements.

DETAILED DESCRIPTION

The following detailed description of the invention is merely exemplary in nature and is not intended to limit the invention or the application and uses of the invention. Furthermore, there is no intention to be bound by any theory presented in the preceding background of the invention or the following detailed description.

According to various embodiments, an apparatus is provided for a high linearity and low noise mixer. In one exemplary embodiment, the apparatus is a mixer circuit having a high linearity low noise mixer. Although the invention is described in the context of CMOS type transistors, a variety of transistors may be used including, by way of example and not of limitation, field effect transistors (FETs), bipolar transistors, and insulated gate bipolar transistors. The mixer circuit is ideally suited for low intermediate frequency (IF) or direct-conversion receiver architectures, such as used in fully integrated wireless receivers, and may be used in a wide variety of radio frequency (RF) transmitters, transceivers, and other receivers, such as found in cellular telephones and wireless communications systems in general.

The mixer circuit includes an input stage for receiving an RF input signal that is coupled to a switch stage by blocking capacitors and input resistors in series with the blocking capacitors. In one embodiment, the input stage includes a buffer, such as a cascode buffer, having a feedback network, such as capacitive feedback, to assist in improving third-order linearity. Low-frequency second-order inter-modulation (IM2) that may be generated in the input stage is generally blocked by the blocking capacitors that couple the input stage to the switch stage. A second-order input intercept point (IIP2) of the mixer circuit is improved by attenuating the received RF input signal across the switch stage using the input resistors and an on-resistance of the switch stage. The input stage also assists in reducing an overall noise figure of the mixer circuit. AC coupling of the mixer circuit generally reduces a stack level normally associated with a conventional Gilbert-cell mixer and allows the input stage to be implemented for low-supply voltage with increased gain.

Figure 1:
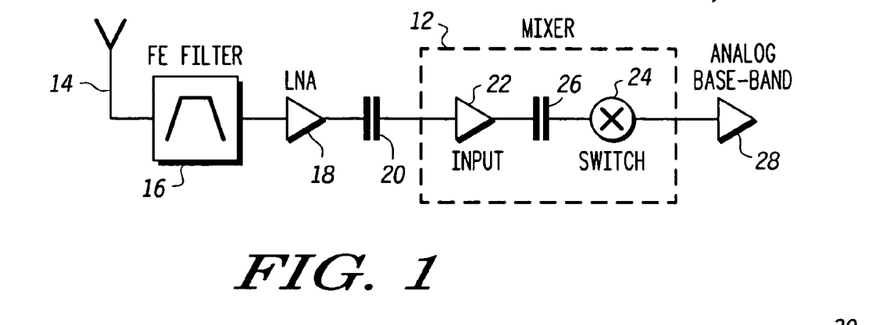
FIG. 1 is a schematic diagram of an exemplary embodiment of a receiver with a mixer.

Referring to the drawings, FIG. 1 is a schematic diagram of an exemplary embodiment of a receiver, shown generally at 10, with a mixer 12. The receiver includes an antenna 14 for receiving an RF input signal, a bandpass filter 16 coupled to the antenna 14, a low noise amplifier (LNA) 18 coupled to the bandpass filter 16, and the previously mentioned mixer 12 coupled to the LNA 18 by a coupling network 20, such as a coupling capacitor, to convert the RF input signal to a baseband signal. The RF input signal may be represented by a differential voltage, $v^+_{RF}$, $v^-_{RF}$. The mixer 12 includes an input stage, shown generally at 22, and a switch stage, shown generally at 24, coupled to the input stage 22 by a blocking capacitor 26. An amplifier 28 is connected to the switch stage 24 and outputs an analog baseband signal.

Figure 2:
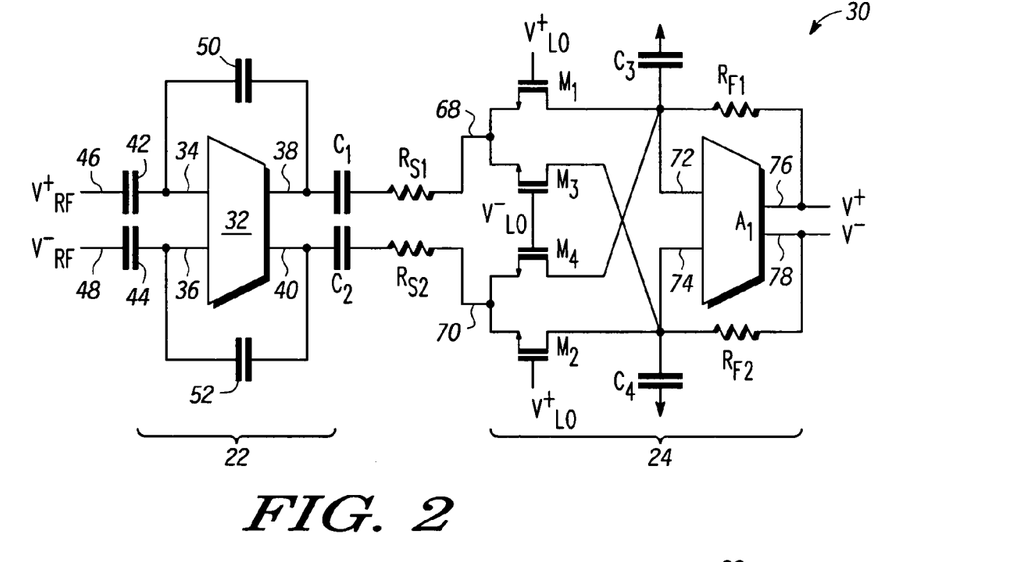
FIG. 2 is a circuit diagram of an exemplary embodiment of a mixer.

FIG. 2 is a circuit diagram of an exemplary embodiment of a mixer, shown generally at 30. The mixer 30 has a first RF input 46 and a second RF input 48, corresponding to the previously mentioned differential RF voltages, $v^+_{RF}$, $v^-_{RF}$, for receiving the RF input signal. In this embodiment, the input stage 22 is coupled to the switch stage 24 by a pair of blocking capacitors, $C_1$, $C_2$. The input stage 22 includes a buffer 32 for reducing noise and increasing gain of the RF input signal. The buffer 32 includes a pair of buffer inputs 34, 36 and a pair of buffer outputs 38, 40. The pair of coupling capacitors 42, 44 connects the buffer inputs 34, 36 to the RF inputs 46, 48. For example, a first coupling capacitor 42 connects a first buffer input 34 with the first RF input 46, and a second coupling capacitor 44 connects a second buffer input 36 with the second RF input 48.

A feedback network connects the buffer inputs 34, 36 to the buffer outputs 38, 40. For example, a pair of feedback capacitors 50, 52 connects the buffer inputs 34, 36 with the buffer outputs 38, 40. In this example, a first feedback capacitor 50 connects the first buffer input 34 with the first buffer output 38, and a second feedback capacitor 52 connects the second buffer input 36 with the second buffer output 40.

Separation of the switch stage 24 from the input stage 22 generally allows for a closed-loop configuration of the input stage 22 using capacitors 50, 52 as feedback, as best shown in FIG. 2. This configuration may generally improve third-order linearity as assisted by negative feedback from the capacitors 50, 52. The input stage in a conventional Gilbert-cell mixer is usually substantially non-linear and accounts for most of the third-order distortion. The AC-coupling of the invented mixer 12, 30 reduces a stack level normally found in conventional Gilbert-cell mixers. In the invented mixer 12, 30, a cascode buffer stage may be implemented for low-supply voltage with increased gain.

Figure 3:
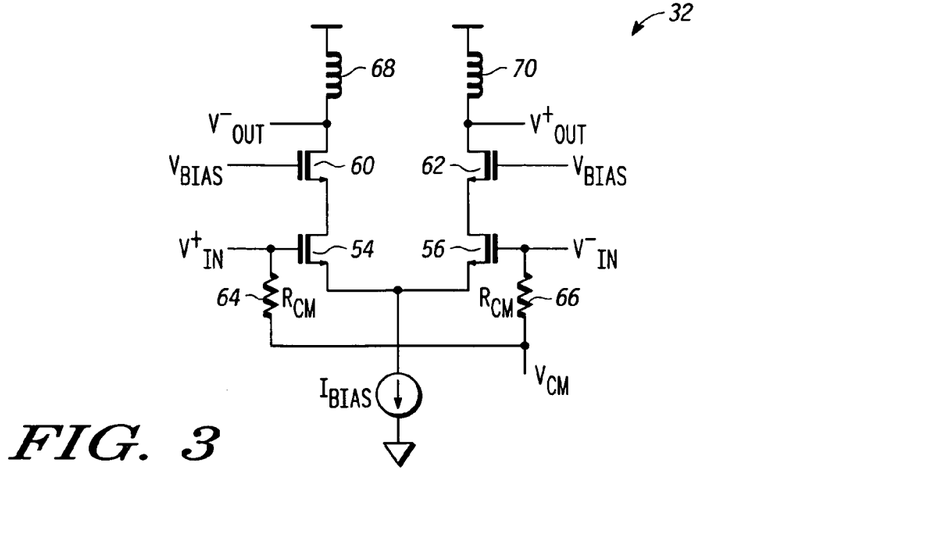
FIG. 3 is a circuit diagram of the buffer in the mixer shown in FIG. 2.

FIG. 3 is a circuit diagram of the buffer 32 in the mixer 30 shown in FIG. 2. In one exemplary embodiment, the buffer 32 is a cascode buffer and includes a pair of output-coupled buffer transistors 54, 56, each of the output-coupled transistors having a transistor 60, 62 coupled to one of the output-coupled transistors 54, 56. The terms "emitter", "source", and "input", as used with respect to transistor elements, are used interchangeably herein to generally indicate a current source component of conventional transistors. The terms "collector", "drain", and "output", as used with respect to transistor elements, are used interchangeably herein to generally indicate a current output component of conventional transistors. Each of the transistors 54, 56, 60, 62 has an input or an emitter or a source, an output or a drain or a collector, and a gate or a base, as is well-known in the art. In one example, the input of a third buffer transistor 60 is connected to the output of the first buffer transistor 54, and the input of a fourth buffer transistor 62 is connected to the output of the second buffer transistor 56. The gate of the first buffer transistor 54 is coupled to the first buffer input 34, and the gate of the second buffer transistor 56 is coupled to second buffer input 36.

A pair of buffer resistors 64, 66 are coupled to the gates of each of the output coupled buffer transistors 54, 56. For example, a first buffer resistor 64, having a value of $R_{cm}$, is connected to the gate of the first buffer transistor 54, a second buffer resistor 66, also having a value of $R_{cm}$, is connected to the gate of the second buffer transistor 56, and the first buffer resistor 64 is coterminous with the second buffer resistor 66. The gate of the first buffer transistor 54 corresponds to the first buffer input 34, and the gate of the second buffer transistor 56 corresponds to the second buffer input 36. The output to the third buffer transistor 60 corresponds to the first buffer output 38, and the output to the fourth buffer transistor 62 corresponds to the second buffer output 40.

A pair of inductors 68, 70 is coupled to the buffer outputs 38, 40. For example, a first inductor 68 is coupled to the output of the third buffer transistor 60 and the first buffer output 38, and a second inductor 70 is coupled to the output of the fourth buffer transistor 62 and the second buffer output 40. This inductor-loaded input buffer design generally provides an output signal having a larger swing range to improve a compression point of the buffer and a third-order input intercept point (IIP3).

Referring back to FIG. 2, the switch stage 24 includes a transistor based switch network having a switch input and a switch output. In one exemplary embodiment, the switch stage 24 has a pair of switch stage inputs 68, 70, LO inputs, $V^+_{LO}$, $V^-_{LO}$, and is coupled to the input stage 22 by the pair of blocking capacitors, $C_1$, $C_2$, and a pair of input resistors, $R_{s1}$, $R_{s2}$. For example, a first blocking capacitor $C_1$ is connected to the first buffer output 38, and a second blocking capacitor $C_2$ is connected to the second buffer output 40. In this example, a first input resistor $R_{s1}$ connects the first blocking capacitor $C_1$ with a first switch stage input 68, and the second input resistor $R_{s2}$ connects the second blocking capacitor $C_2$ with a second switch stage input 70.

In one exemplary embodiment, the transistor based switch network includes a first transistor $M_1$, a second transistor $M_2$, a third transistor $M_3$, a fourth transistor $M_4$, an operational amplifier (OPAM), A, a pair of feedback resistors, $R_{f1}$, $R_{f2}$, and a pair of shunting capacitors, $C_3$, $C_4$. Each of the transistors $M_1$, $M_2$, $M_3$, $M_4$ has an input, an output, and a gate. The input of the third transistor $M_3$ is commonly connected to the input of the first transistor $M_1$ and one of the switch stage inputs 68, and the output of the second transistor $M_2$ is coupled to the output of the third transistor $M_3$. The input of the second transistor $M_2$ is commonly connected to the input of the fourth transistor $M_4$ and the second switch stage input 70, and the output of the first transistor $M_1$ is coupled to the output of the fourth transistor $M_4$. A first LO input, $V^+_{LO}$, is coupled to the gate of the first transistor $M_1$ and the gate of the second transistor $M_2$, and a second LO input, $V^-_{LO}$, is coupled to the gate of the third transistor $M_3$ and the gate of the fourth transistor $M_4$.

The OPAM, A, has a pair of OPAM inputs 72, 74 and a pair of OPAM outputs 76, 78. A first OPAM input 72 is connected to the output of the first transistor $M_1$ and the output of the fourth transistor $M_4$, and a second OPAM input 74 is connected to the output of the second transistor $M_2$ and the output of the third transistor $M_3$. Each of the feedback resistors, $R_{f1}$, $R_{f2}$, respectively interconnects one of the OPAM inputs 72, 74 with one of the OPAM outputs 76, 78. Each of the shunting capacitors, $C_3$, $C_4$, respectively connects the output of the first transistor $M_1$ and the output of the second transistor $M_2$ to ground. For example, a first feedback resistor $R_{f1}$ interconnects the first OPAM input 72 with the first OPAM output 76, and a second feedback resistor $R_{f2}$ interconnects the second OPAM input 74 with the second OPAM output 78. In this example, a first shunting capacitor $C_3$ connects the output of the first transistor $M_1$ to ground, and a second shunting capacitor $C_4$ connects the output of the second transistor $M_2$ to ground. As best shown in FIG. 2, the OPAM outputs 76, 78 correspond to outputs, $v^+$, $v^-$, of the mixer 30.

In one embodiment, the switch stage 24 is biased in a deep triode region with zero bias current. Increasing LO drive level may improve linearity as generally found in an active mixer. Because the mixer input buffer bias current, $I_{bias}$, does not pass through the switches or transistors $M_1$, $M_2$, $M_3$, $M_4$ of the switch stage 24, the switch size may be made relatively small, allowing the LO drive level to be generally increased without increasing current drain. Additionally, because of the bias in the deep triode region, i.e., the DC voltage across the drain and source is about zero, any reference to a particular node of the transistor(s) as source or drain is merely for convenience and generally does not affect performance of the switch stage 24.

Low-frequency IM2 distortion generated in the input stage 22 may be blocked by the blocking capacitors $C_1$, $C_2$ that couple the input stage 22 to the switch stage 24. The IIP2 of the switch stage 24 is improved by attenuating the RF signal applied across the switch stage 24. This attenuation may be accomplished using the input resistors $R_{s1}$, $R_{s2}$ and an on-resistance of the switch stage 24. Mismatch resulting from the switch stage transistors $M_1$, $M_2$, $M_3$, $M_4$ is reduced by a quadratic of a ratio corresponding to the aforementioned attenuation. The high linearity low noise mixer 12, 30 and receiver 10 incorporating such mixer can generally tolerate more mismatches from the switch stage transistors $M_1$, $M_2$, $M_3$, $M_4$ and rely on better matching design from passive components of the receiver 10, which can generally be matched more closely than active components.

Figure 4:
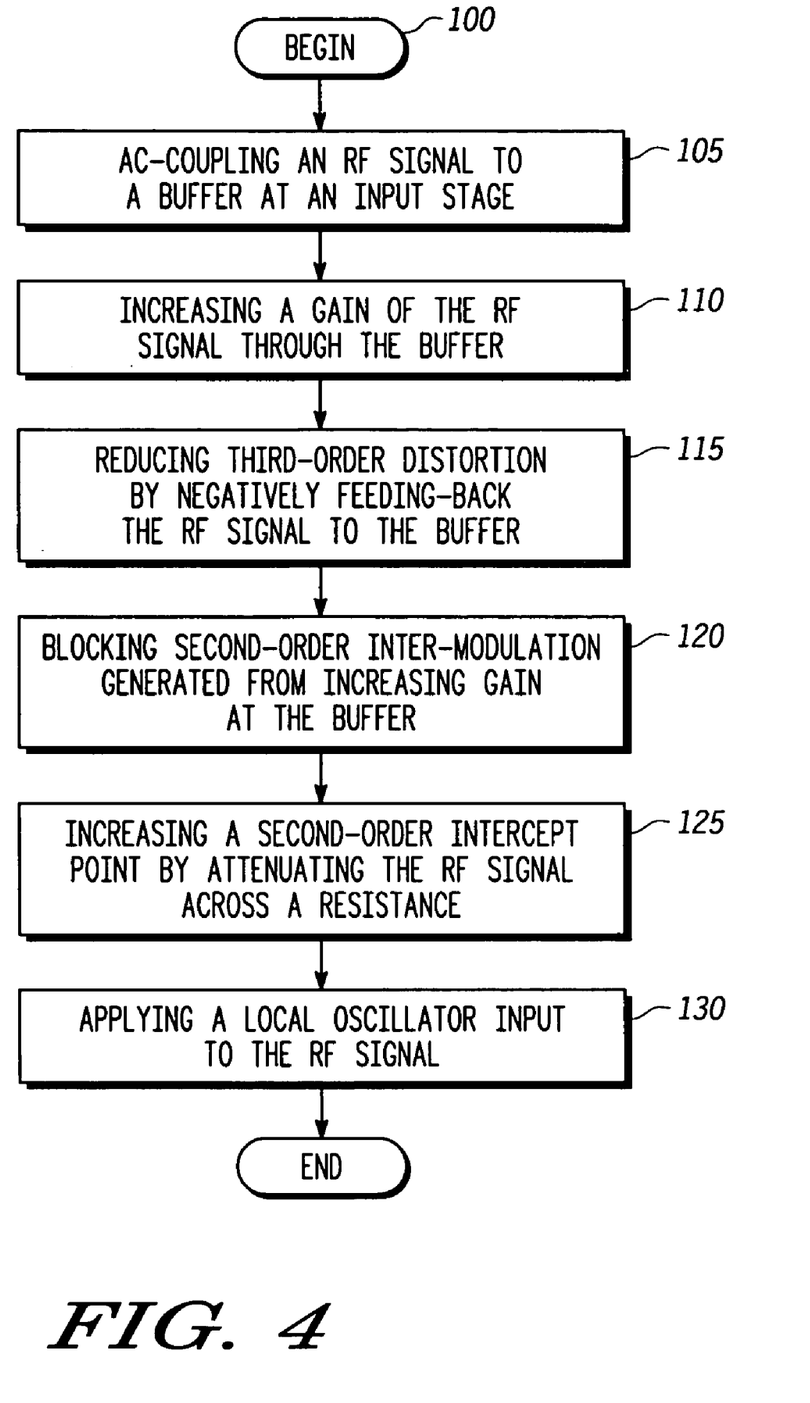
FIG. 4 is a flow diagram of a method of reducing noise and second order inter-modulation (IM2) spurs.

FIG. 4 is a flow diagram of a method of reducing noise and second order distortion. The method begins at step 100. The RF input signal is applied to the buffer 32 (FIG. 2) at the input stage 22 (FIG. 2) by AC coupling the signal via the coupling capacitors 42, 44 (FIG. 2) at step 105, such as by applying the differential voltage, $v^+_{RF}$, $v^-_{RF}$. In one embodiment, the differential voltage is received from the LNA 18 (FIG. 1) and passed through the coupling capacitors 42, 44 (FIG. 2).

The buffer 32 (FIG. 2) increases the gain of the RF signal at step 110 through the cascode arrangement of the transistors 60, 62, 64, 66 (FIG. 3). In one embodiment, the compression point of the buffer 32 is significantly increased by the inductive loading 68, 70 (FIG. 3) at the buffer output 38, 40 (FIG. 2).

Third-order distortion is reduced at step 115 by negative feedback of the RF signal from the buffer outputs 38, 40 (FIG. 2) to the buffer inputs 34, 36 (FIG. 2) through the feedback capacitors 50, 52 (FIG. 2). This negative feedback of the RF input signal improves third-order linearity.

Low-frequency IM2 distortion generated from the input stage 22 (FIG. 2) is blocked from passing to the switch stage 24 (FIG. 2) by the blocking capacitors, $C_1$, $C_2$ (FIG. 2), at step 120.

After the signal has passed the blocking capacitors, $C_1$, $C_2$ (FIG. 2), the signal is attenuated through the input resistors, $R_{s1}$, $R_{s2}$ (FIG. 2), and the on-resistance associated with the switch stage transistors, $M_1$, $M_2$, $M_3$, $M_4$ (FIG. 2) at step 125. This attenuation improves the IIP2 of the switch stage 24 (FIG. 2).

LO drive signals are applied to the RF signal at the switch stage 24 at $V^+_{LO}$, $V^-_{LO}$ at step 130. After passing the switch transistors $M_1$, $M_2$, $M_3$, $M_4$ (FIG. 2), low-frequency components of the signal pass via the feedback resistors, $R_{f1}$, $R_{f2}$ (FIG. 2) to the mixer output at $v^+$, $v^-$ (FIG. 2). The shunting capacitors, $C_3$, $C_4$ (FIG. 2), short high-frequency components of the signal to ground.

When differential LO drive signals are applied to the switch stage 24 at $V^+_{LO}$, $V^-_{LO}$, this generally causes M1 and M2 to be turned-on at one time and M3 and M4 to be turned-on at another time. In a conventional Gilbert-cell mixer, the switch stage is assumed to be perfectly matched, and mismatches mainly result from the input stage transistors. The input stage of the conventional Gilbert-cell mixer determines the overall IIP2 of the Gilbert-cell mixer.

In the high linearity low noise mixer 12, 30, the IM2 distortion, generated in the input stage 22, is blocked by the blocking capacitors, $C_1$, $C_2$, and the switch stage 24 remains as a possible mismatch source. Mismatches are considered for the two switch transistors that are turned-on at substantially the same time, e.g., M1 and M2, M3 and M4, respectively. The voltage gain of the input stage 22 is taken from the IIP2 of the switch stage 24 to obtain the overall IIP2 of the high linearity low noise mixer 12, 30. The input stage 22 helps to reduce the overall noise figure of the mixer 12, 30. Additionally, when the LO is driven by digital, near square-wave, and quadrature signals, this mixer circuit provides the flexibility to adjust a cross-over point of the differential LO signal to be lower than a threshold voltage of the transistors so as to further reduce noise from the switch stage 24.

Two MOSFET transistors may differ in geometry, e.g., a channel width W and a channel length L. Difference in the channel length may also cause difference in the mobility $\mu$. Any mismatches in the oxide thickness may cause different capacitance, $C_{ox}$, to be associated therewith. In addition, two transistors may also have different threshold voltages. If $V_t$ represents the threshold voltage and $\beta$ is defined as $$\beta = \mu \cdot C_{ox} \cdot \frac{W}{L}$$

the two MOS transistors with mismatches may be expressed as $V_{t1} = V_t + \Delta V_t$ $V_{t2} = V_t - \Delta V_t$ $\beta_1 = \beta + \Delta\beta$ $\beta_2 = \beta - \Delta\beta$ The mismatches in the resistors of the high linearity low noise mixer 30 (FIG. 1) may be represented as $R_{f1} = R_f + \Delta R_f$ $R_{f2} = R_f - \Delta R_f$ $R_{s1} = R_s + \Delta R_s$ $R_{s2} = R_s - \Delta R_s$ $R_{L2} = R_L + \Delta R_L$ $R_{L2} = R_L - \Delta R_L$ In addition, mismatches may occur in the RF input signal which may be expressed as $v_{DS}^+ = v_{DS} + \Delta v_{DS}$  $v_{DS}^- = v_{DS} - \Delta v_{DS}$ $v_{RF}^+ = v_{RF} + \Delta v_{RF}$  $v_{RF}^- = v_{RF} - \Delta v_{RF}$ IIP2 for the high linearity low noise mixer may be derived based on a simplified configuration of the mixer 30 (FIG. 2) when two transistors, e.g., $M_1$, $M_2$, are turned-on at about the same time. The current, flowing in transistor M1 and M2, is given by $$i^+ = (\beta + \Delta\beta) \cdot \left[V_{GS} - (V_t + \Delta V_t) - \frac{1}{2} \cdot v_{DS}^+\right] \cdot v_{DS}^+ \quad (A\text{-}1)$$

$$= (\beta + \Delta\beta) \cdot \left[(V_{GS} - V_t) - \Delta V_t - \frac{1}{2} \cdot v_{DS}^+\right] \cdot v_{DS}^+$$

$$i^- = (\beta - \Delta\beta) \cdot \left[V_{GS} - (V_t - \Delta V_t) - \frac{1}{2} \cdot v_{DS}^-\right] \cdot v_{DS}^- \quad (A\text{-}2)$$

$$= (\beta - \Delta\beta) \cdot \left[(V_{GS} - V_t) + \Delta V_t - \frac{1}{2} \cdot v_{DS}^-\right] \cdot v_{DS}^-$$

The difference and summation of these two currents are $$i^+ - i^- = \beta \cdot (V_{GS} - V_t) \cdot v_{DS}^+ - \beta \cdot \Delta V_t \cdot v_{DS}^+ - \frac{1}{2} \cdot \beta \cdot v_{DS}^{+2} + \quad (A\text{-}3)$$
$$\Delta\beta \cdot (V_{GS} - V_t) \cdot v_{DS}^+ - \Delta\beta \cdot \Delta V_t \cdot v_{DS}^+ -$$
$$\frac{1}{2} \cdot \Delta\beta \cdot v_{DS}^{+2} - \beta \cdot (V_{GS} - V_t) \cdot v_{DS}^- -$$
$$\beta \cdot \Delta V_t \cdot v_{DS}^- + \frac{1}{2} \cdot \beta \cdot v_{DS}^{-2} +$$
$$\Delta\beta \cdot (V_{GS} - V_t) \cdot v_{DS}^- + \Delta\beta \cdot \Delta V_t \cdot v_{DS}^- -$$
$$\frac{1}{2} \cdot \Delta\beta \cdot v_{DS}^{-2}$$
$$= \beta \cdot (V_{GS} - V_t) \cdot (v_{DS}^+ - v_{DS}^-) -$$
$$\beta \cdot \Delta V_t \cdot (v_{DS}^+ + v_{DS}^-) - \frac{1}{2} \cdot \beta \cdot (v_{DS}^{+2} - v_{DS}^{-2}) +$$
$$\Delta\beta \cdot (V_{GS} - V_t) \cdot (v_{DS}^+ + v_{DS}^-) -$$
$$\Delta\beta \cdot \Delta V_t \cdot (v_{DS}^+ - v_{DS}^-) - \frac{1}{2} \cdot \Delta\beta \cdot (v_{DS}^{+2} + v_{DS}^{-2})$$
$$= [\beta \cdot (V_{GS} - V_t) - \Delta\beta \cdot \Delta V_t - \beta \cdot \Delta v_{DS}] \cdot$$
$$(v_{DS}^+ - v_{DS}^-) + [\Delta\beta \cdot (V_{GS} - V_t) - \beta \cdot \Delta V_t] \cdot$$
$$2 \cdot \Delta v_{DS} - \frac{1}{2} \cdot \Delta\beta \cdot (v_{DS}^{+2} + v_{DS}^{-2})$$

$$i^+ + i^- = \beta \cdot (V_{GS} - V_t) \cdot v_{DS}^+ - \beta \cdot \Delta V_t \cdot v_{DS}^+ - \frac{1}{2} \cdot \beta \cdot v_{DS}^{+2} + \quad (A\text{-}4)$$
$$\Delta\beta \cdot (V_{GS} - V_t) \cdot v_{DS}^+ - \Delta\beta \cdot \Delta V_t \cdot v_{DS}^+ -$$
$$\frac{1}{2} \cdot \Delta\beta \cdot v_{DS}^{+2} + \beta \cdot (V_{GS} - V_t) \cdot v_{DS}^- +$$
$$\beta \cdot \Delta V_t \cdot v_{DS}^- - \frac{1}{2} \cdot \beta \cdot v_{DS}^{-2} - \Delta\beta \cdot (V_{GS} - V_t) \cdot$$
$$v_{DS}^- - \Delta\beta \cdot \Delta V_t \cdot v_{DS}^- + \frac{1}{2} \cdot \Delta\beta \cdot v_{DS}^{-2}$$
$$= \beta \cdot (V_{GS} - V_t) \cdot (v_{DS}^+ + v_{DS}^-) - \beta \cdot \Delta V_t \cdot$$
$$(v_{DS}^+ - v_{DS}^-) - \frac{1}{2} \cdot \beta \cdot (v_{DS}^{+2} + v_{DS}^{-2}) +$$
$$\Delta\beta \cdot (V_{GS} - V_t) \cdot (v_{DS}^+ - v_{DS}^-) -$$
$$\Delta\beta \cdot \Delta V_t \cdot (v_{DS}^+ + v_{DS}^-) - \frac{1}{2} \cdot \Delta\beta \cdot (v_{DS}^{+2} - v_{DS}^{-2})$$
$$= [\Delta\beta \cdot (V_{GS} - V_t) - \beta \cdot \Delta V_t - \Delta\beta \cdot \Delta v_{DS}] \cdot$$
$$(v_{DS}^+ - v_{DS}^-) + [\beta \cdot (V_{GS} - V_t) - \Delta\beta \cdot \Delta V_t] \cdot$$
$$2 \cdot \Delta v_{DS} - \frac{1}{2} \cdot \beta \cdot (v_{DS}^{+2} + v_{DS}^{-2})$$
$$= [\Delta\beta \cdot (V_{GS} - V_t) - \beta \cdot \Delta V_t] \cdot (v_{DS}^+ - v_{DS}^-) +$$
$$\beta \cdot (V_{GS} - V_t) \cdot 2 \cdot \Delta v_{DS} - \frac{1}{2} \beta \cdot (v_{DS}^{+2} + v_{DS}^{-2})$$

The output voltages at each node are given by $v^+ = -R_{f1} \cdot i^+ = -(R_f + \Delta R_f) \cdot i^+$ \quad (A-5)

$v^- = -R_{f2} \cdot i^- = -(R_f - \Delta R_f) \cdot i^-$ \quad (A-6)

The differential output is given by $v^+ - v^- = -R_f \cdot (i^+ - i^-) - \Delta R_f \cdot (i^+ + i^-)$ \quad (A-7)

-continued $$= -R_f \cdot \left\{ \beta \cdot (V_{GS} - V_t - \Delta v_{DS}) \cdot (v_{DS}^+ - v_{DS}^-) - \frac{1}{2} \cdot \Delta\beta \cdot (v_{DS}^{+2} + v_{DS}^{-2}) \right\} - \Delta R_f \cdot$$

$$\left\{ [\Delta\beta \cdot (V_{GS} - V_t) - \beta \cdot \Delta V_t] \cdot (v_{DS}^+ - v_{DS}^-) + \beta \cdot (V_{GS} - V_t) \cdot 2 \cdot \Delta v_{DS} - \frac{1}{2} \beta \cdot (v_{DS}^{+2} + v_{DS}^{-2}) \right\}$$

$$= -R_f \cdot \beta \cdot (V_{GS} - V_t - \Delta v_{DS}) \cdot (v_{DS}^+ - v_{DS}^-) + \frac{1}{2} \cdot R_f \cdot \beta \cdot \left( \frac{\Delta\beta}{\beta} + \frac{\Delta R_f}{R_f} \right) \cdot (v_{DS}^{+2} + v_{DS}^{-2})$$

Considering $$v_{RF}^+ = v_{DS}^+ + i^+ \cdot R_{s1} \text{ and } v_{RF}^- = v_{DS}^- + i^- \cdot R_{s2}, \text{ we have} \quad (A\text{-}8)$$

$$v_{RF}^+ - v_{RF}^- = v_{DS}^+ - v_{DS}^- + i^+ \cdot (R_s + \Delta R_s) - i^- \cdot (R_s - \Delta R_s)$$
$$= v_{DS}^+ - v_{DS}^- + R_s \cdot (i^+ - i^-) + \Delta R_s \cdot (i^+ + i^-)$$
$$= v_{DS}^+ - v_{DS}^- + R_s \cdot \left[ \beta \cdot (V_{GS} - V_t - \Delta v_{DS}) \cdot (v_{DS}^+ - v_{DS}^-) - \frac{1}{2} \cdot \Delta\beta \cdot (v_{DS}^{+2} + v_{DS}^{-2}) \right] +$$
$$\Delta R_s \cdot \left\{ [\Delta\beta \cdot (V_{GS} - V_t) - \beta \cdot \Delta V_t] \cdot (v_{DS}^+ - v_{DS}^-) + \beta \cdot (V_{GS} - V_t) \cdot 2 \cdot \Delta v_{DS} - \frac{1}{2} \cdot \beta \cdot (v_{DS}^{+2} + v_{DS}^{-2}) \right\}$$
$$= [1 + R_s \cdot \beta \cdot (V_{GS} - V_t - \Delta v_{DS})] \cdot (v_{DS}^+ - v_{DS}^-) - \frac{1}{2} \cdot R_s \beta \cdot \left( \frac{\Delta\beta}{\beta} + \frac{\Delta R_s}{R_s} \right) \cdot (v_{DS}^{+2} + v_{DS}^{-2})$$

From A-8, $v_{DS}^+ - v_{DS}^-$ can be expressed as $$(v_{DS}^+ - v_{DS}^-) = \frac{v_{RF}^+ - v_{RF}^-}{1 + R_s \cdot \beta \cdot (V_{GS} - V_t - \Delta v_{DS})} + \frac{1}{2} \cdot \frac{R_s \cdot \beta}{1 + R_s \cdot \beta \cdot (V_{GS} - V_t - \Delta v_{DS})} \cdot \left( \frac{\Delta\beta}{\beta} + \frac{\Delta R_s}{R_s} \right) \cdot (v_{DS}^{+2} + v_{DS}^{-2}) \quad (A\text{-}9)$$

Substituting (A-9) into (A-7), $$v^+ - v^- = -R_f \cdot \beta \cdot (V_{GS} - V_t - \Delta v_{DS}) \quad (A\text{-}10)$$
$$\left\{ \frac{v_{RF}^+ - v_{RF}^-}{1 + R_s \cdot \beta \cdot (V_{GS} - V_t - \Delta v_{DS})} + \frac{1}{2} \cdot \frac{R_s \cdot \beta}{1 + R_s \cdot \beta \cdot (V_{GS} - V_t - \Delta v_{DS})} \cdot \left( \frac{\Delta\beta}{\beta} + \frac{\Delta R_s}{R_s} \right) \cdot (v_{DS}^{+2} + v_{DS}^{-2}) \right\} + \frac{1}{2} \cdot R_f \cdot \beta \cdot \left( \frac{\Delta\beta}{\beta} + \frac{\Delta R_f}{R_f} \right) \cdot (v_{DS}^{+2} + v_{DS}^{-2})$$

-continued $$= -\frac{R_f \cdot \beta \cdot (V_{GS} - V_t - \Delta v_{DS})}{1 + R_s \cdot \beta \cdot (V_{GS} - V_t - \Delta v_{DS})} \cdot (v_{RF}^+ - v_{RF}^-) +$$
$$\frac{1}{2} \cdot R_f \cdot \beta \cdot \left\{ -\frac{R_s \cdot \beta \cdot (V_{GS} - V_t - \Delta v_{DS})}{1 + R_s \cdot \beta \cdot (V_{GS} - V_t - \Delta v_{DS})} \cdot \left( \frac{\Delta\beta}{\beta} + \frac{\Delta R_s}{R_s} \right) + \left( \frac{\Delta\beta}{\beta} + \frac{\Delta R_f}{R_f} \right) \right\} \cdot (v_{DS}^{+2} + v_{DS}^{-2})$$

$$= -\frac{R_f \cdot \beta \cdot (V_{GS} - V_t - \Delta v_{DS})}{1 + R_s \cdot \beta \cdot (V_{GS} - V_t - \Delta v_{DS})} \cdot (v_{RF}^+ - v_{RF}^-) +$$
$$\frac{1}{2} \cdot R_f \cdot \beta \cdot \left[ \frac{1}{1 + R_s \cdot \beta \cdot (V_{GS} - V_t - \Delta v_{DS})} \cdot \frac{\Delta\beta}{\beta} + \frac{\Delta R_f}{R_f} - \frac{R_s \cdot \beta \cdot (V_{GS} - V_t - \Delta v_{DS})}{1 + R_s \cdot \beta \cdot (V_{GS} - V_t - \Delta v_{DS})} \cdot \frac{\Delta R_s}{R_s} \right] \cdot (v_{DS}^{+2} + v_{DS}^{-2})$$

Substituting $v_{RF}^+ - v_{RF}^- = 2 \cdot v_{RF}$ and $v_{DS}^+ - v_{DS}^- = 2 \cdot v_{DS}$ into (A-9), $$v_{DS} = \frac{v_{RF}}{1 + R_s \cdot \beta \cdot (V_{GS} - V_t - \Delta v_{DS})} + \quad (A\text{-}11)$$
$$\frac{1}{4} \cdot \frac{R_s \cdot \beta}{1 + R_s \cdot \beta \cdot (V_{GS} - V_t - \Delta v_{DS})} \cdot \left( \frac{\Delta\beta}{\beta} + \frac{\Delta R_s}{R_s} \right) \cdot (v_{DS}^{+2} + v_{DS}^{-2})$$

Neglecting the second-order terms, $$v_{DS}^{+2} + v_{DS}^{-2} = (v_{DS} + \Delta v_{DS})^2 = (v_{DS} - \Delta v_{DS})^2 = 2 \cdot v_{DS}^2 \quad (A\text{-}12)$$

Substituting (A-11) into (A-12) and retaining terms up to the quadratic terms, $$(v_{DS}^{+2} + v_{DS}^{-2}) = 2 \cdot \left( \frac{v_{RF}}{1 + R_s \cdot \beta \cdot (V_{GS} - V_t - \Delta v_{DS})} \right)^2 \quad (A\text{-}13)$$

Substituting (A-13) and $v_{RF}^+ - v_{RF}^- = 2 \cdot v_{RF}$ into (A-10), $$v^+ - v^- = a \cdot v_{RF} + b \cdot v_{RF}^2 \quad (A\text{-}14)$$

where $$a = -\frac{2 \cdot R_f \cdot \beta \cdot (V_{GS} - V_t - \Delta v_{DS})}{1 + R_s \cdot \beta \cdot (V_{GS} - V_t - \Delta v_{DS})} \quad (A\text{-}15)$$

$$b = \frac{R_f \cdot \beta}{[1 + R_s \cdot \beta \cdot (V_{GS} - V_t - \Delta v_{DS})]^2} \cdot \quad (A\text{-}16)$$
$$\left[ \frac{1}{1 + R_s \cdot \beta \cdot (V_{GS} - V_t - \Delta v_{DS})} \cdot \frac{\Delta\beta}{\beta} + \frac{\Delta R_f}{R_f} - \frac{R_s \cdot \beta \cdot (V_{GS} - V_t - \Delta v_{DS})}{1 + R_s \cdot \beta \cdot (V_{GS} - V_t - \Delta v_{DS})} \cdot \frac{\Delta R_s}{R_s} \right]$$

Finally, the IIP2 for the high linearity low noise mixer can be expressed as $$IIP2(V) = \frac{|a|}{|b|} \quad \text{(A17)}$$

$$= \frac{2 \cdot (V_{GS} - V_t - \Delta v_{DS})}{\frac{1}{[1 + R_s \cdot \beta \cdot (V_{GS} - V_t - \Delta v_{DS})]^2} \cdot \left|\frac{\Delta \beta}{\beta}\right| + \frac{1}{1 + R_s \cdot \beta \cdot (V_{GS} - V_t - \Delta v_{DS})} \cdot \left|\frac{\Delta R_f}{R_f}\right| + \frac{R_s \cdot \beta \cdot (V_{GS} - V_t - \Delta v_{DS})}{[1 + R_s \cdot \beta \cdot (V_{GS} - V_t - \Delta v_{DS})]^2} \cdot \left|\frac{\Delta R_s}{R_s}\right|}$$

For comparison, the IIP2 for a conventional Gilbert-cell mixer is given by $$IIP2(V) = \frac{|a|}{|b|} = \frac{2 \cdot (V_{gs} - V_t + \Delta v_{RF})}{\left|\frac{\Delta \beta}{\beta}\right| + \left|\frac{\Delta R_L}{R_L}\right|}.$$

The high linearity low noise mixer 12, 30 is more tolerable of mismatches from the transistors. Because the resistor matching can generally be more easily achieved than the transistor matching, improving resistor matching assists in increasing the IIP2. Additionally, mismatches from the RF input signal generally have less impact over the IIP2 of the invented mixer 12, 30, and mismatch due to transistor threshold voltage generally has no impact on the IIP2.

Table 1 is a summary of IIP2 requirements at various stages for examples of a conventional receiver with a Gilbert-cell mixer. In one example, IIP2 requirements are calculated for two-tone systems such as Global System for Mobile Telecommunications (GSM), and in another example, IIP2 requirements are calculated for one-tone systems such as Enhanced Data Rates for Global Evolution (EDGE). To meet receiver sensitivity under interference, an input referred IM2 should be about 8 dB below a desired RF signal.

TABLE 1

|  | Two-tone (GSM) | One-tone (EDGE) |
|---|---|---|
| Interfering signal (dBm) | −29 | −28 |
| Desired signal (dBm) | −99 | −99 |
| Required SNR to achieve 2% BER (dB) | 8 | 8 |
| Input referred IM2 (dBm) | −107 | −107 |
| IIP2 at antenna input (dBm) | 49 | 51 |
| Front-end loss (dB) | 3 | 3 |
| IIP2 at LNA input (dBm) | 46 | 48 |
| LNA gain (dB) | 21 | 21 |
| IIP2 at mixer input (dBm) | 67 | 69 |
| Mixer input stage gain (dB) | 14 | 14 |
| IIP2 at switch stage (dBm) | 81 | 83 |

Table 2 is a comparison of IIP2 for different resistors and device sizes of one example of a conventional Gilbert-cell mixer. Transistor parameters for this example of a 0.18 μ process include $\mu \cdot C_{ox} = 250 \times 10^{-6}$ A/V$^2$ and $V_T = 0.75$V. The resistor value is given as $R_s = 2000\Omega$ and $R_f = 23.4$ KΩ. The LO drive is a square wave signal between the gate and the source. The peak of the amplitude of this signal is 1.8 V, i.e., $V_{gs} = 1.8$V. In the conventional Gilbert-cell mixer, Table 2 shows that both the transistor mismatch and the resistor mismatch should generally be better than 0.1% in order to meet mixer specification. This mixer specification is based on the receiver sensitivity under interference where IM2 should be 8 dB below a desired RF signal.

TABLE 2

|  |  | Resistor Mismatch | | |
|---|---|---|---|---|
|  |  | 1% | 0.1% | 0.01% |
| Transistor Mismatch | 0.1% | 55.6 | 70.4 | 75.6 |
|  | 1% | 50.4 | 55.6 | 56.4 |
|  | 5% | 40.9 | 42.3 | 42.4 |
|  | 10% | 35.6 | 36.4 | 36.4 |

Table 3 is a comparison of IIP2 for different resistors and device sizes of one example of the high linearity low noise mixer. In the high linearity low noise mixer example, Table 3 shows that for smaller transistor size, because the on-resistance is relatively high and the ratio R is relatively small, a 0.1% resistor mismatch meets the IIP2 specification of the high linearity low noise mixer. For larger transistor size, because the on-resistance is relatively small and the ratio R is relatively large, a 1% resistor mismatch meets the IIP2 specification of the high linearity low noise mixer. Additionally, Table 3 shows that the IIP2 has little change when the transistor mismatch varies between 0.1% and 10%.

TABLE 3

|  |  | Resistor Mismatch | | |
|---|---|---|---|---|
|  |  | 1% | 0.1% | 0.01% |
| Rs = 0 |  |  |  |  |
| Transistor Mismatch | 0.1% | 41.6 | 56.4 | 61.6 |
|  | 1% | 36.4 | 41.6 | 42.4 |
|  | 5% | 26.9 | 28.3 | 28.4 |
|  | 10% | 21.6 | 22.4 | 22.4 |
| Rs/Ron = 21, W/L = 90 |  |  |  |  |
| Transistor Mismatch | 0.1% | 63.5 | 83.3 | 101.7 |
|  | 1% | 63.3 | 81.7 | 93.0 |
|  | 5% | 62.5 | 76.8 | 81.4 |
|  | 10% | 61.7 | 73.0 | 75.8 |
| Rs/Ron = 47.25, W/L = 90 |  |  |  |  |
| Transistor Mismatch | 0.1% | 70.2 | 90.1 | 109.3 |
|  | 1% | 70.1 | 89.3 | 104.0 |
|  | 5% | 69.7 | 87.7 | 94.3 |
|  | 10% | 69.3 | 84.0 | 89.0 |

The high linearity low noise mixer can tolerate more mismatches due to the transistors. Moderate resistor matching, such as 0.1% to 1%, is generally needed for the IIP2 specification. The invented mixer circuit can tolerate large transistor mismatches, such as up to 10%. The conventional Gilbert-cell mixer usually requires high precision of matching, such as 0.1% for both the transistors and the resistors, in order to meet the IIP2 specification. In general, mixer design is particularly difficult because low 1/f noise and high linearity are usually contrasting requirements. The invented mixer circuit topology provides an overall mixer performance having low noise performance of the buffer stage, high IIP3 of the buffer stage, and high IIP2 of the switch stage.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A mixer circuit comprising:
a radio frequency (RF) signal input;
a coupling network coupled to said RF signal input;
a buffer coupled to said coupling network, said buffer having a first buffer input and a first buffer output;
a feedback network coupling said first buffer input and said first buffer output;
a blocking capacitor coupled to said first buffer output;
an input resistor coupled to said blocking capacitor;
a switch network having a switch input and a switch output, said switch input coupled to said input resistor;
a local oscillator (LO) input coupled to said switch network; and
an operational amplifier (OPAM) having an OPAM input coupled to said switch output.

2. A mixer circuit according to claim 1, wherein said coupling network is a coupling capacitor, said buffer is a cascode buffer, and said feedback network is a feedback capacitor.

3. A mixer circuit according to claim 1 further comprising:
a feedback resistor coupling said OPAM input to an OPAM output of said OPAM; and
a shunting capacitor coupling said OPAM input to a ground.

4. A mixer circuit according to claim 1, wherein said buffer comprises a second buffer input and a second buffer output;
wherein said RF signal input comprises a first RF signal input and a second RF signal input;
wherein said coupling network comprises a pair of coupling capacitors, each of said pair of coupling capacitors coupling one of said first buffer input and said second buffer input with one of said first RF signal input and said second RF signal input; and
wherein said feedback network comprises a pair of feedback capacitors, each of said pair of feedback capacitors coupling one of said first buffer input and said second buffer input with one of said first buffer output and said second buffer output.

5. A mixer circuit according to claim 4, wherein said buffer comprises:
a first buffer transistor having an input, an output, and a gate, said gate coupled to a first buffer input;
a second buffer transistor having an input, an output, and a gate, said gate coupled to said second buffer input;
a first buffer resistor coupled to said gate of said first buffer transistor;
a second buffer resistor coupled to said gate of said second buffer transistor, said first buffer resistor coterminous with said second buffer resistor;
a third buffer transistor having an input, an output, and a gate, said input of said third buffer transistor coupled to said output of said first buffer transistor;
a fourth buffer transistor having an input, an output, and a gate, said input of said fourth buffer transistor coupled to said output of said second buffer transistor;
a first inductor coupled to said output of said third buffer transistor; and
a second inductor coupled to said output of said fourth buffer transistor.

6. A mixer circuit according to claim 5, wherein each of said first buffer transistor, said second buffer transistor, said third buffer transistor, and said fourth buffer transistor is a metal oxide semiconductor (MOS) transistor.

7. A mixer circuit according to claim 5, wherein each of said first buffer transistor, said second buffer transistor, said third buffer transistor, and said fourth buffer transistor is a complementary metal oxide semiconductor (CMOS) transistor.

8. A mixer circuit according to claim 4, wherein a first feedback capacitor of said pair of feedback capacitors couples said first buffer input and said first buffer output; wherein a second feedback capacitor of said pair of feedback capacitors couples said second buffer input and said second buffer output; wherein a first coupling capacitor of said pair of coupling capacitors couples said first RF signal input and said first buffer input; and wherein a second coupling capacitor of said pair of coupling capacitors couples said second RF signal input and said second buffer input.

9. A mixer circuit according to claim 1, wherein said LO input comprises a pair of LO inputs; wherein said input resistor comprises a first input resistor and a second input resistor; and wherein said switch network comprises:
a first switch transistor having an input, an output, and a gate;
a second switch transistor having an input, an output, and a gate, said gate of said first switch transistor and said gate of said second switch transistor coupled to a first LO input of said pair of LO inputs;
a third switch transistor having an input, an output, and a gate, said input of said third switch transistor commonly coupled to said input of said first switch transistor and said first input resistor, said output of said second switch transistor coupled to said output of said third switch transistor; and
a fourth switch transistor having an input, an output and a gate, said input of said second switch transistor commonly coupled to said input of said fourth switch transistor and said second input resistor, said output of said first switch transistor coupled to said output of said fourth switch transistor, said gate of said third switch transistor and said gate of said fourth switch transistor coupled to a second LO input of said pair of LO inputs.

10. A mixer circuit according to claim 9, wherein said OPAM input comprises a first OPAM input and a second OPAM input, said first OPAM input coupled to said output of said first switch transistor and said output of said fourth switch transistor, said second OPAM input coupled to said output of said second switch transistor and said output of said third switch transistor;
wherein said OPAM comprises a pair of OPAM outputs; and
wherein said mixer circuit further comprises:
a pair of feedback resistors, each of said pair of feedback resistors coupling one of said first OPAM input and said second OPAM input with one of said pair of OPAM outputs; and
a pair of shunting capacitors, each of said pair of shunting capacitors coupling one of said output of said first switch transistor and said output of said second switch transistor to a ground.

11. A mixer circuit according to claim 10, wherein a first shunting capacitor of said pair of shunting capacitors couples said output of said first switch transistor and said output of said fourth switch transistor to ground; and wherein a second shunting capacitor of said pair of shunting capacitors couples said output of said second switch transistor and said output of said third switch transistor to ground.

12. A mixer circuit according to claim 9, wherein each of said first switch transistor, said second switch transistor, said third switch transistor, and said fourth switch transistor is a MOS transistor.

13. A mixer circuit according to claim 9, wherein each of said first switch transistor, said second switch transistor, said third switch transistor, and said fourth switch transistor is a CMOS transistor.

14. A mixer circuit according to claim 1, wherein said buffer comprises a second buffer input and a second buffer output; wherein said switch input comprises a pair of switch inputs; wherein said blocking capacitor comprises:
a first blocking capacitor coupled to said first buffer output; and
a second blocking capacitor coupled to said second buffer output; and
wherein said input resistor comprises:
a first input resistor coupling said first blocking capacitor and a first switch input of said pair of switch inputs; and
a second input resistor coupling said second blocking capacitor and a second switch input of said pair of switch inputs.

15. A direct conversion radio receiver comprising:
an antenna configured to receive a radio frequency (RF) signal;
a bandpass filter coupled to said antenna;
a low noise amplifier (LNA) coupled to said bandpass filter;
a coupling network coupled to said LNA;
a mixer having a local oscillator (LO) input, said mixer comprising:
 a buffer having a buffer input and a buffer output, said buffer input coupled to said coupling network;
 a feedback network coupling said buffer input with said buffer output;
 a blocking capacitance coupled to said buffer output;
 an input resistance coupled to said blocking capacitance;
 a switch network coupled to said LO input, said switch network having a switch input and a switch output, said switch input coupled to said input resistance; and
 an operational amplifier (OPAM) having an OPAM input coupled to said switch output.

16. A receiver according to claim 15, wherein said buffer comprises an inductance coupled to said buffer output.

17. A receiver according to claim 15, wherein said coupling network is a coupling capacitance, said buffer is a cascode buffer, and said feedback network is a feedback capacitance.

18. A receiver according to claim 17, wherein said cascade buffer comprises:
a first buffer transistor having an input, an output, and a gate, said gate coupled to said coupling capacitance;
a second buffer transistor having an input, an output, and a gate, said gate coupled to said coupling capacitance;
a first buffer resistor coupled to said gate of said first buffer transistor;
a second buffer resistor coupled to said gate of said second buffer transistor, said first buffer resistor coterminous with said second buffer resistor;
a third buffer transistor having an input, an output, and a gate, said input of said third buffer transistor coupled to said output of said first buffer transistor;
a fourth buffer transistor having an input, an output, and a gate, said input of said fourth buffer transistor coupled to said output of said second buffer transistor;
a first inductor coupled to said output of said third buffer transistor; and
a second inductor coupled to said output of said fourth buffer transistor.

19. A receiver according to claim 18, wherein said blocking capacitance comprises a pair of blocking capacitors, a first blocking capacitor of said pair of blocking capacitors coupled to said first buffer output, a second blocking capacitor of said pair of blocking capacitors coupled to said second buffer output.

20. A receiver according to claim 19, wherein said switch input comprises a pair of switch inputs; and wherein said input resistance comprises a pair of input resistors, a first input resistor of said pair of input resistor coupling said first blocking capacitor with a first switch input of said pair of switch inputs, a second input resistor of said pair of input resistors coupling said second blocking capacitor with a second switch input of said pair of switch inputs.

21. A receiver according to claim 18, wherein each transistor of said switch network, said first buffer transistor, said second buffer transistor, said third buffer transistor, and said fourth buffer transistor is a metal oxide semiconductor (MOS).

22. A receiver according to claim 18, wherein each transistor of said switch network, said first buffer transistor, said second buffer transistor, said third buffer transistor, and said fourth buffer transistor is a complementary metal oxide semiconductor (CMOS).

23. A receiver according to claim 17, wherein said cascode buffer comprises a first buffer input and a second buffer input; wherein said buffer output comprises a first buffer output and a second buffer output; wherein said feedback capacitance comprises:
a first feedback capacitor coupling said first buffer input with said first buffer output; and
a second feedback capacitor coupling said second buffer input with said second buffer output; and
wherein said coupling capacitance comprises:
a first coupling capacitor coupling said LNA with said first buffer input; and
a second coupling capacitor coupling said LNA with said second buffer input.

24. A receiver according to claim 17, wherein said OPAM comprises:
a pair of OPAM inputs;
a pair of OPAM outputs; and
a feedback resistance coupling said pair of OPAM inputs with said pair of OPAM outputs, said feedback resistance comprising:
a first feedback resistor coupling a first OPAM input of said pair of OPAM inputs with a first OPAM output of said pair of OPAM outputs; and
a second feedback resistor coupling a second OPAM input of said pair of OPAM inputs with a second OPAM output of said pair of OPAM outputs.

25. A receiver according to claim 17, wherein said switch output comprises a pair of switch outputs; and wherein said mixer further comprises:
a first shunting capacitor coupling a first output of said pair of switch outputs to ground; and a second shunting capacitor coupling a second output of said pair of switch outputs to ground.

26. A method of reducing noise and distortion in a demodulated radio frequency (RF) signal, said method comprising the steps of:

AC coupling an RF signal;

increasing a gain of the RF signal;

reducing third-order distortion by negatively feeding-back the RF signal;

blocking IM2 generated from said gain increasing step;

increasing a second-order input intercept point (IIP2) by attenuating the RF signal across a resistance; and applying a local oscillator input to the RF signal.

27. A method according to claim 26 further comprising the step of shunting high-frequency components of the attenuated signal.

28. A method according to claim 26 further comprising the step of increasing a compression point of a buffer by inductively loading the RF signal after said gain increasing step.

29. A method according to claim 26 further comprising the step of amplifying a low-frequency baseband component of the RF signal.

* * * * *